(12) United States Patent
Kang

(10) Patent No.: US 9,543,850 B2
(45) Date of Patent: Jan. 10, 2017

(54) ELECTRONIC APPARATUS AND POWER CONTROLLING METHOD

(71) Applicant: SAMSUNG ELECTRONICS CO., LTD., Suwon-si (KR)

(72) Inventor: Ho-woong Kang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 236 days.

(21) Appl. No.: 14/323,662

(22) Filed: Jul. 3, 2014

(65) Prior Publication Data

US 2015/0028838 A1  Jan. 29, 2015

(30) Foreign Application Priority Data

Jul. 25, 2013  (KR) .................... 10-2013-0088239

(51) Int. Cl.
| | |
|---|---|
| *G06F 1/32* | (2006.01) |
| *H02M 5/293* | (2006.01) |
| *H03H 7/01* | (2006.01) |
| *H03H 7/06* | (2006.01) |
| *G06F 1/26* | (2006.01) |

(52) U.S. Cl.
CPC ............ *H02M 5/293* (2013.01); *G06F 1/3231* (2013.01); *G06F 1/3246* (2013.01); *G06F 1/3287* (2013.01); *H03H 7/0138* (2013.01); *H03H 7/06* (2013.01); *G06F 1/26* (2013.01); *H02M 2005/2932* (2013.01); *Y02B 60/1282* (2013.01); *Y02B 60/1289* (2013.01)

(58) Field of Classification Search
CPC ............. G06F 1/32; G06F 1/26; H02M 5/293; H03H 7/1038
USPC .......................................................... 713/300
See application file for complete search history.

(56) References Cited

U.S. PATENT DOCUMENTS

| | | |
|---|---|---|
| 4,394,720 A | 7/1983 | Gabor |
| 5,586,332 A | 12/1996 | Jain et al. |
| 5,754,571 A | 5/1998 | Endoh et al. |

(Continued)

FOREIGN PATENT DOCUMENTS

| | | |
|---|---|---|
| EP | 2492776 A2 | 8/2012 |
| WO | 2007012065 A2 | 1/2007 |

OTHER PUBLICATIONS

Communication dated Jan. 9, 2015, issued by the European Patent Office in counterpart European Application No. 14173553.0.

(Continued)

*Primary Examiner* — Thomas Lee
*Assistant Examiner* — Volvick Derose
(74) *Attorney, Agent, or Firm* — Sughrue Mion, PLLC

(57) ABSTRACT

An electronic apparatus and a method of controlling power thereto are disclosed. The electronic apparatus including: a signal receiver configured to receive an input signal; a power supply configured to supply power to elements of the electronic apparatus; a controller configured to controls power supplied to the power supply; and a driving circuit configured to output an ON signal to the power supply in order to supply power to the elements of the electronic apparatus in response to the signal receiver receiving a preset frequency signal while the controller is turned off. Thus, the electronic apparatus is automatically turned on and off by an input signal of a predetermined frequency without a user's manipulation of an additional power switch, and thus, a user's convenience may be improved.

25 Claims, 8 Drawing Sheets

(56) References Cited

U.S. PATENT DOCUMENTS

| | | | |
|---|---|---|---|
| 5,905,688 A | 5/1999 | Park | |
| 6,650,376 B1* | 11/2003 | Obitsu | H03J 1/0008 348/570 |
| 6,670,798 B1 | 12/2003 | Lorello et al. | |
| 7,095,437 B1* | 8/2006 | Hatakeyama | H04N 5/232 348/231.7 |
| 7,800,351 B2 | 9/2010 | Gan | |
| 8,013,476 B2 | 9/2011 | Lee | |
| 8,058,858 B2 | 11/2011 | Gan | |
| 2006/0067188 A1* | 3/2006 | Umehara | G11B 19/10 369/47.15 |
| 2008/0165289 A1* | 7/2008 | Furutani | H04N 5/4401 348/725 |
| 2008/0218634 A1* | 9/2008 | Chang | G09G 5/005 348/552 |
| 2009/0022508 A1* | 1/2009 | Yamaguchi | G03G 15/5004 399/37 |
| 2009/0102971 A1* | 4/2009 | Chang | H04N 5/63 348/554 |
| 2009/0279915 A1* | 11/2009 | Adams | G03G 15/0283 399/88 |
| 2010/0131782 A1* | 5/2010 | Higuchi | H04N 5/77 713/310 |
| 2010/0164460 A1 | 7/2010 | Hsiao et al. | |
| 2010/0174926 A1* | 7/2010 | Huang | G06F 1/26 713/300 |
| 2010/0301029 A1 | 12/2010 | Meckler et al. | |
| 2012/0173007 A1* | 7/2012 | Liu | H04R 1/1041 700/94 |
| 2012/0182004 A1* | 7/2012 | Higuchi | H02P 29/0088 323/284 |
| 2012/0223765 A1* | 9/2012 | Wang | G06F 1/3206 327/534 |
| 2012/0319824 A1* | 12/2012 | Bares | G06F 1/12 340/10.3 |
| 2014/0294204 A1* | 10/2014 | Lin | H03F 3/181 381/120 |

OTHER PUBLICATIONS

Alan Yates, "Alan Yates' Laboratory—Active HF Probe", Sep. 2, 2006, URL: http://web.archive.org/web/20130504070215/http://www.vk2zay.net/article/90, 2 pages total, XP 055155431.

Communication dated Dec. 11, 2015, issued by the European Patent Office in counterpart European Application No. 14173553.0.

* cited by examiner

ELECTRONIC APPARATUS AND POWER CONTROLLING METHOD

CROSS-REFERENCE TO RELATED APPLICATION

This application claims priority from Korean Patent Application No. 10-2013-0088239, filed on Jul. 25, 2013 in the Korean Intellectual Property Office, the disclosure of which is incorporated herein by reference, in its entirety.

BACKGROUND

Technical Field

Apparatuses and methods consistent with the exemplary embodiments relate to an electronic apparatus and a power controlling method. More particularly, the exemplary embodiments relate to an electronic apparatus and a power controlling method which controls power supplied by a power supply.

Description of the Related Art

An electronic apparatus such as a television (TV), a monitor or an audio amplifier which outputs images or sound has a power supply therein to supply power necessary for its operation. In response to a predetermined period of time elapsing without performance of any operation, the electronic apparatus may enter a sleep mode (or a stand-by mode) in which power supplied to some of elements of the electronic apparatus is suspended, in order to reduce power consumption.

Even after the electronic apparatus enters a sleep mode, the electronic apparatus receives stand-by power in order to perform minimum operations. That is, a controller receives stand-by power even in response to the electronic apparatus being in the sleep mode. Thus upon wake-up from the sleep mode, the controller may control the power supply to supply power to respective elements of the electronic apparatus.

FIG. 1 is a block diagram of an electronic apparatus 10 of the related art.

As shown therein, a controller 15 of the electronic apparatus 10 of the related art controls a power supply, i.e., turning a power supply 14 on and off. Specifically, the controller 15 controls the power supply 14 to turn on the power supply 14 and supply power to respective elements 11, 12 and 13 of the electronic apparatus 10 in a normal mode. In response to the electronic apparatus entering the sleep mode, the controller 15 cuts off power supplied to the respective elements 11, 12 and 13.

Therefore, there is a need to turn on the controller 15 even in response to the electronic apparatus 10 being turned off. Since the controller 15 receives power, this limits a reduction of power consumption. Accordingly, it is difficult to satisfy a zero watt setting according to regulations related to stand-by power consumption for saving energy.

SUMMARY

The foregoing and/or other aspects may be achieved by providing an electronic apparatus including: a signal receiver configured to receive an input signal; a power supply configured to supply power to elements of the electronic apparatus; a controller configured to control power supplied to the power supply; and a driving circuit configured to output an ON signal to the power supply in order to supply power to the elements of the electronic apparatus in response to the signal receiver receiving a preset frequency signal, while the controller is turned off.

The preset frequency signal may include a clock frequency of a wired digital signal or a carrier frequency of a wireless digital signal.

The signal receiver may be configured to receive at least one of a wired digital signal, a wireless digital signal and an analog signal.

The signal receiver may be configured to receive the analog signal to which the preset frequency signal has been added.

The electronic apparatus may further include a filter which passes the preset frequency signal out of the input signals and transmits the preset frequency signal to the driving circuit.

The driving circuit may include a transistor which is turned on and off by an input of the preset frequency signal, and a capacitor to which voltages are charged according to turning on and off of the transistor.

The driving circuit may output a rising edge according to the charging of the capacitor, and may apply an ON signal to the power supply which corresponds to the rising edge.

The ON signal of the driving circuit may correspond to one of a rising edge signal and a falling edge signal.

The preset frequency signal may include a plurality of frequencies, and the filter may include a plurality of band pass filters that pass the plurality of frequencies in a preset order.

The plurality of frequencies may be variable.

The power supply may supply power to the controller which remains turned off according to the ON signal, and the controller may determine whether the signal receiver receives the preset frequency signal.

The controller may output an OFF signal to the power supply in response to the signal receiver not receiving the preset frequency signal.

According to an aspect of another exemplary embodiment, a method of controlling power to an electronic apparatus which includes a power supply is provided, the power controlling method includes: receiving an input signal while a controller controlling power supply of the power supply is turned off; and outputting an ON signal to the power supply by the driving circuit in response to the received input signal including a preset frequency signal.

The preset frequency signal may include a clock frequency of a wired digital signal or a carrier frequency of a wireless digital signal.

The receiving the input signal may include receiving at least one of a wired digital signal, a wireless digital signal and an analog signal.

The receiving the input signal may include receiving the analog signal to which the preset frequency signal has been added.

The power controlling method may further include passing the preset frequency signal out of the input signal by a filter and transmitting the preset frequency signal to the driving circuit.

The ON signal of the driving circuit may correspond to one of a rising edge signal and a falling edge signal.

The preset frequency signal may include a plurality of frequencies, and the transmitting the preset frequency signal may include passing the plurality of frequencies in a preset order.

The plurality of frequencies may be variable.

The power controlling method may further include: supplying power by the power supply according to the ON signal to the controller that is turned off; and determining by the controller whether the preset frequency signal is continuously received.

The power controlling method may further include: outputting an OFF signal to the power supply by the controller in response to the preset frequency signal not being received within a within a predetermined period of time.

An aspect of the exemplary embodiments may provide an electronic apparatus including: a power supply configured to supply power to elements of the electronic apparatus; a controller configured to control power supplied to the power supply; and a driving circuit configured to output an ON signal to the power supply in order to supply power to the elements of the electronic apparatus in response to the electronic apparatus receiving a preset frequency signal from an external device while the controller is turned off.

The electronic apparatus may further include a signal receiver configured to receive the input signal.

The electronic apparatus may further include a filter which passes the preset frequency signal out of the input signals and transmits the preset frequency signal to the driving circuit.

The driving circuit may include a transistor which is turned on and off by an input of the preset frequency signal, and a capacitor to which voltages are charged according to the transistor turning on and off.

The driving circuit may output a rising edge according to the charging of the capacitor, and apply an ON signal to the power supply which corresponds to the rising edge.

BRIEF DESCRIPTION OF THE DRAWINGS

The above and/or other aspects will become apparent and more readily appreciated from the following description of the exemplary embodiments, taken in conjunction with the accompanying drawings, in which.

DETAILED DESCRIPTION OF EXEMPLARY EMBODIMENTS

Figure 1:
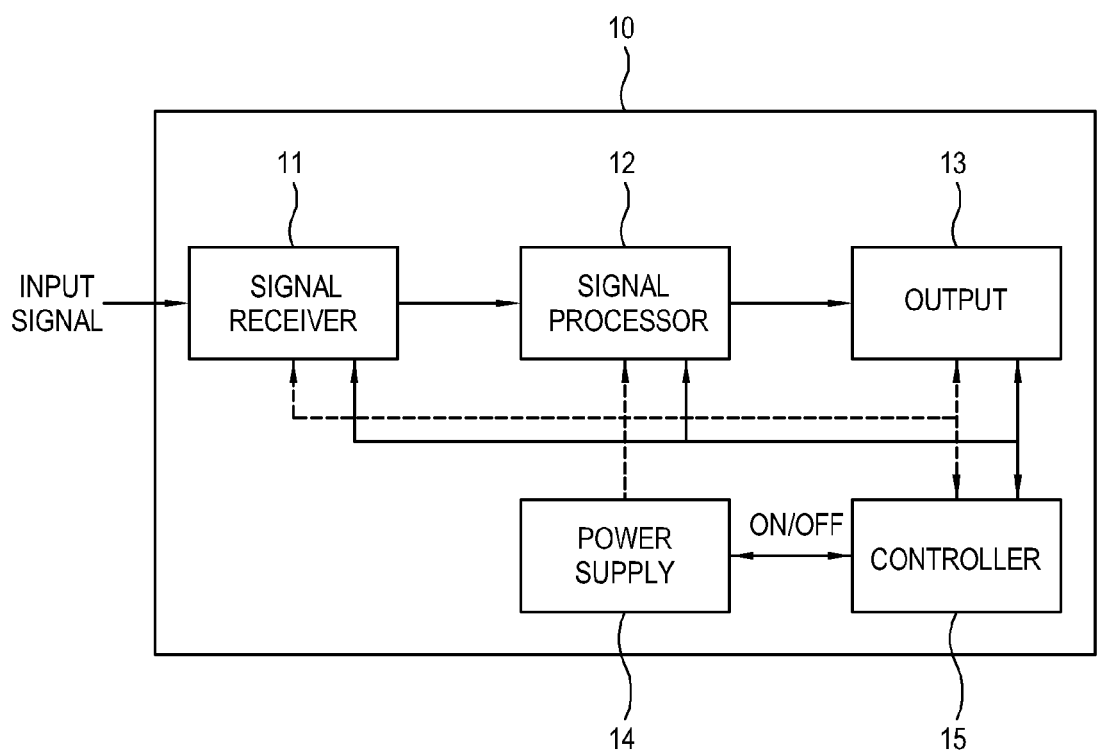
FIG. 1 is a block diagram of an electronic apparatus of the related art.

Below, exemplary embodiments will be described in detail with reference to accompanying drawings so as to be easily understood by a person having ordinary knowledge in the art. The exemplary embodiments may be embodied in various forms without being limited to the exemplary embodiments set forth herein. Descriptions of well-known parts are omitted for clarity, and like reference numerals refer to like elements throughout.

Figure 2:
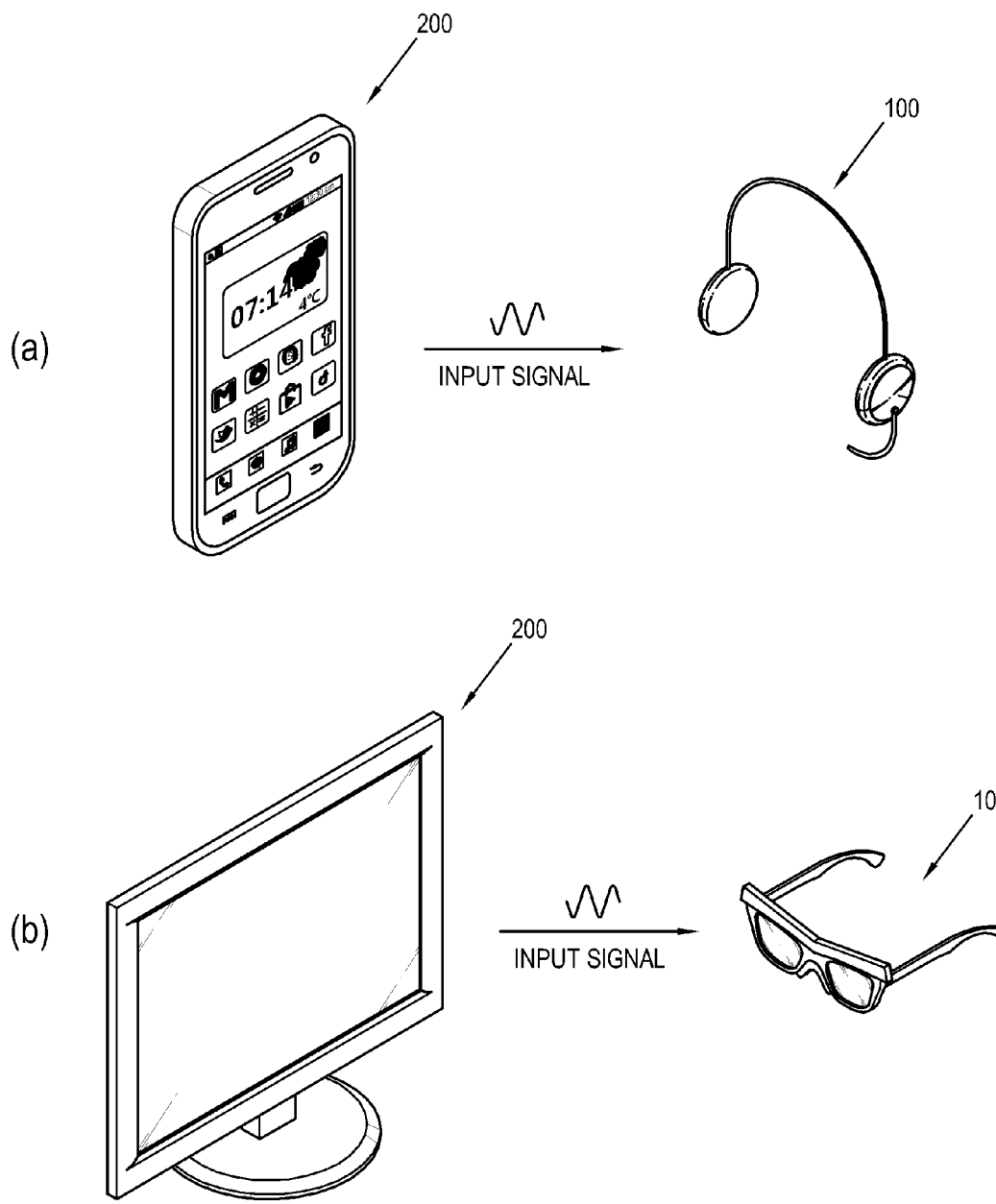
FIG. 2 illustrates an example of an electronic apparatus according to an exemplary embodiment.
Figure 3:
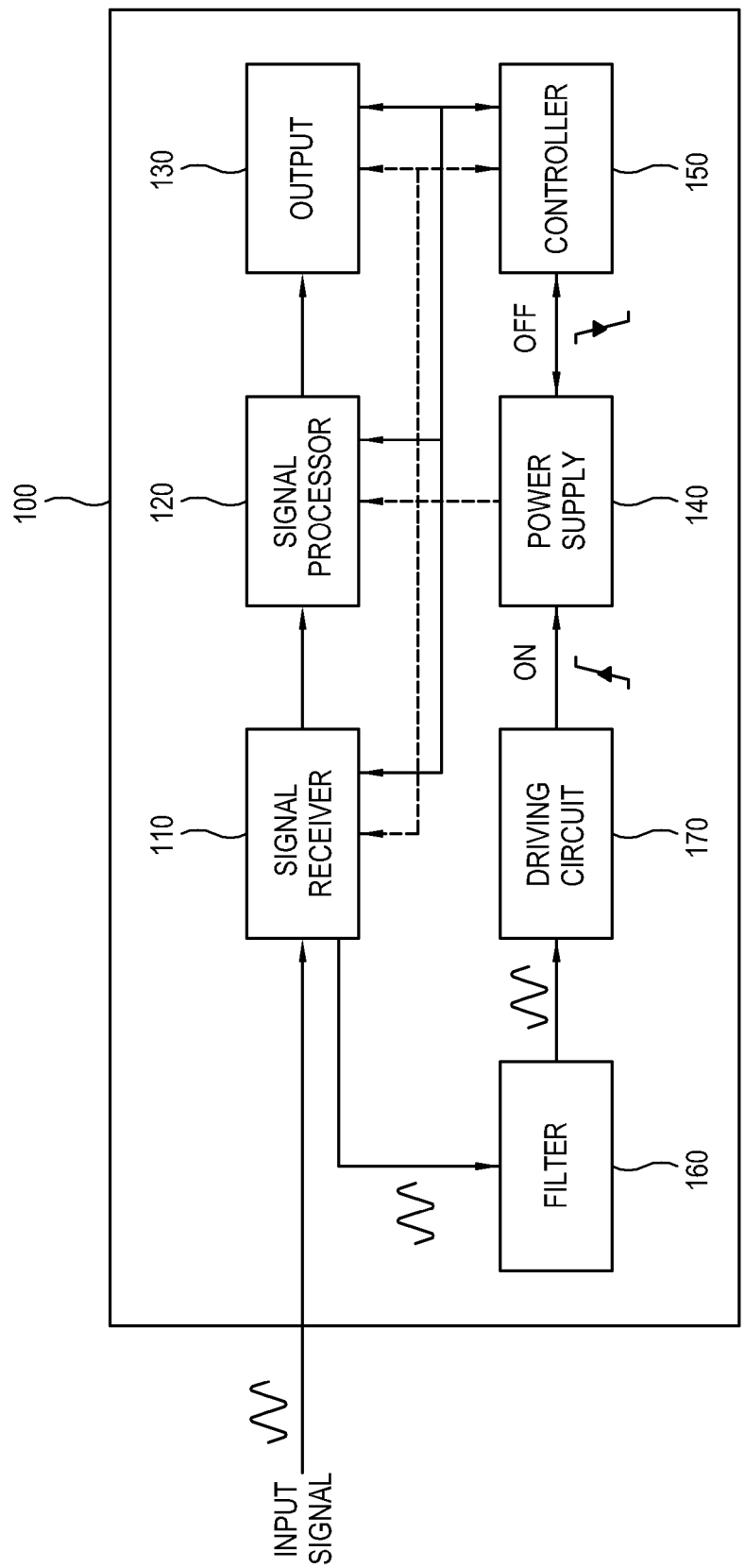
FIG. 3 is a block diagram of the electronic apparatus according to an exemplary embodiment.
Figure 4:
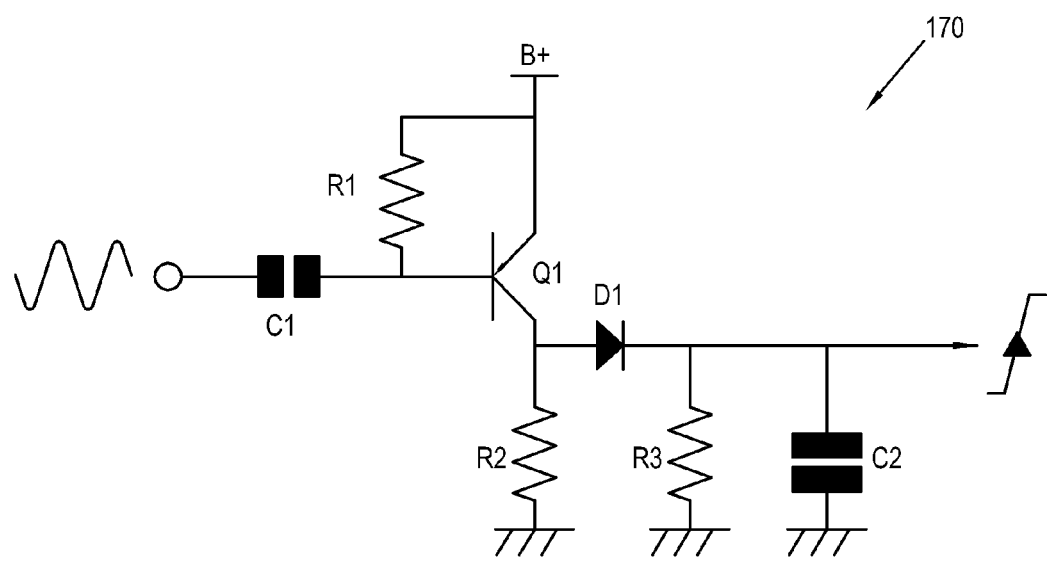
FIG. 4 is a circuit diagram of a driving circuit in FIG. 3.

FIG. 2 illustrates an example of an electronic apparatus 100 according to an exemplary embodiment. FIG. 3 is a block diagram of the electronic apparatus 100 according to an exemplary embodiment. FIG. 4 is a circuit diagram of driving circuit 160 which is illustrated in FIG. 3.

The electronic apparatus 100 according to an exemplary embodiment may be a portable apparatus which receives an input signal from a predetermined signal generating apparatus 200. For example, as shown in FIG. 2, the signal generating apparatus 200 may be an MP3 player (including a mobile phone or a tablet PC which has an MP3 playing function) and the electronic apparatus 100 may be a wired or wireless headset. Otherwise, the signal generating apparatus 200 may be a 3D television (TV) and the electronic apparatus 100 may be 3D glasses. The signal generating apparatus 200 provides the portable apparatus 100, i.e., an output apparatus with an image or voice signal, and the portable apparatus 100 outputs an image or voice which corresponds to the signal provided by the signal generating apparatus 200.

The electronic apparatus 100 performs a wired or wireless communication with the signal generating apparatus 200, and during such wired or wireless communication, a signal at a preset frequency (clock frequency or carrier frequency) may be transmitted by the signal generating apparatus 200 to the electronic apparatus 100.

FIG. 2 illustrates the electronic apparatus 100 which is implemented as an MP3 player and 3D glasses, but the electronic apparatus 100 according to an exemplary embodiment is not limited thereto and may alternatively be implemented as a display apparatus such as a TV or a monitor; a portable apparatus such as a mobile phone or a tablet PC; a computer such as a desktop computer or a laptop computer; or a home theater, such as an audio dock.

As shown in FIG. 3, the electronic apparatus 100 includes a signal receiver 110 which receives an input signal, a signal processor 120 which processes the signal received by the signal receiver 110, an output circuit 130 which outputs an image and audio processed by the signal processor 120, a power supply 140 which supplies power to respective elements of the electronic apparatus 100 and a controller 150 which controls the electronic apparatus 100.

As shown in FIG. 3, the electronic apparatus 100 according to an exemplary embodiment may further include a filter 160 which passes a preset frequency signal there through out of input signals of the signal receiver 110, and a driving circuit 170 which receives the preset frequency signal of the filter 160 and outputs an ON signal to the power supply 140.

The signal receiver 110 receives an input signal from the outside, including the signal generating apparatus 200 and transmits the input signal to the signal processor 120. The input signal may include an image signal (video signal) or a voice signal (audio signal).

In response to the electronic apparatus 100 being a display apparatus such as a TV or a portable apparatus such as a mobile phone or a tablet PC which has a display function, the signal receiver 110 may receive an image signal. The signal receiver 110 may be implemented as various types of receivers which correspond to a standard of a received image signal and an implementation type of the electronic apparatus 100. For example, the signal receiver 110 may receive a radio frequency (RF) signal wirelessly from a broadcast station (not shown), or may receive an image signal in a wired manner according to standards such as composite video, component video, super video, SCART, and high definition multimedia interface (HDMI). In response to an image signal being a broadcast signal, the signal receiver 110 includes a tuner to tune the broadcast signal per channel.

An input signal may be input by an external apparatus. For example, the input signal may be input by an external apparatus such as a PC, an AV apparatus, a TV, a smart phone and a smart pad; i.e., by the signal generating apparatus 200. The input signal may result from data which is received through a network such as the Internet. In this case, the signal receiver 110 may include a network communication device to communicate with the outside, including the signal generating apparatus 200.

The signal receiver 110 may employ wired or wireless communication for its communication. The wireless communication includes RF, Zigbee®, Bluetooth®, Wi-Fi, Ultra Wideband (UWB) and Near Field Communication (NFC). According to an exemplary embodiment, the signal receiver 110 may be built in the electronic apparatus 100 or may be implemented as a dongle or a module to be attached to a connector (not shown) of the electronic apparatus 100.

In response to the signal receiver 110 including a wired communicator, the signal receiver 110 receives a wired digital signal including a clock signal at a preset frequency (clock frequency). In response to the signal receiver 110 including a wireless communicator, the signal receiver receives a wireless digital signal at a preset frequency (carrier frequency). Out of input signals which are input through the signal receiver 110, a preset frequency signal (clock signal or carrier frequency signal) is transmitted to the driving circuit 170 through the filter 160.

The type of the input signals received by the signal receiver 110 is not limited, and may include at least one of a wired digital signal, a wireless digital signal and an analog signal. In response to the signal receiver 110 receiving an analog signal, the signal receiver 110 may receive an input signal to which a preset frequency signal is added.

The signal processor 120 performs preset various signal processing operations with respect to an input signal. The signal processor 120 outputs the processed input signal to the output 130. For example, the signal processor 120 may include at least one of an image processor to process an image signal, and an audio processor to process an audio signal.

In response to the signal processor 120 including an image processor, the image processor divides an image signal into a video signal, an audio signal and other various additional signals. The image processing operations of the image processor may include, without limitation, decoding which corresponds to various image formats, de-interlacing, frame refresh rate conversion, scaling, noise reduction for improving image quality, detail enhancement and line scanning.

The signal processor 120 may be implemented as a group of individual elements which may independently perform the foregoing operations, or as a system-on-chip (SoC) which integrates various functions.

The output 130 outputs the signal processed by the signal processor 120. The output 130 may include at least one of a display to display an image thereon, and an audio output to output sound.

In response to output 130 including a display, the type of display implemented is not limited and may include various display types such as liquid crystal, plasma, light-emitting diode (LED), organic light-emitting diode (OLED), surface-conduction electron-emitter, carbon nano-tube, and nano-crystal. The display may further include additional elements according to its type of implementation. More specifically, the display may include a display panel, a driver which drives the display panel, and a timing controller (T-con) which is connected to a front portion of the display panel, controls the driver circuit and improves image quality. For example, in response to the electronic apparatus 100 being a display apparatus including liquid crystal or light-emitting diode, the electronic apparatus 100 may further include a backlight (not shown) which emits light to the display panel.

In response to the output 130 including an audio output, the audio output may include a speaker to output audio.

The power supply 140 supplies power to respective elements that form the electronic apparatus 100. The power supply 140 may convert commercial alternating current (AC) power input by an outside device, into power to be supplied to the respective elements of the electronic apparatus 100. The power supply 140 may be implemented as a switching mode power supply (SMPS).

Otherwise, in response to the electronic apparatus 100 being a small portable apparatus (or mobile apparatus) such as a wireless headset, 3D glasses or a mobile phone, the power supply 140 may be implemented as a battery that may be charged or discharged.

The power supply 140 according to an exemplary embodiment is implemented to be turned on by the driving circuit 170 (to be described later) and to be turned off by a control operation of controller 150.

The controller 150 performs controls operations for various elements of the electronic apparatus 100. For example, the controller 150 controls the signal processor 120 to process signals, and performs a control operation which corresponds to various commands received by the signal receiver 110, to thereby control overall operations of the electronic apparatus 100.

In response to the electronic apparatus 100 being turned off, the controller 150, according to an exemplary embodiment is turned off, i.e., does not receive power.

The filter 160 passes a signal at a preset particular frequency, out of input signals received by the signal receiver 110, there through and transmits the signal to the driving circuit 170. The filter 160 according to an exemplary embodiment may include at least one band pass filter (BPF) which passes a particular frequency.

The preset frequency may be a clock frequency of a wired digital signal or a carrier frequency of a wireless digital signal. The filter 160 is set to selectively pass signals in a particular frequency band (inherent frequency) which corresponds to a type of communication supported by the signal receiver 110. The frequency that is passed by the filter 160 may vary.

For example, in response to the signal receiver 110 including a wireless communicator that supports Bluetooth, the signal receiver 110 may receive 2.4 GHz wireless digital signal from the signal generating apparatus 200. The filter 160 passes a 2.4 GHz signal out of input signals that are received through the signal receiver 110.

To do so, the signal generating apparatus 200 may transmit signals at a particular frequency (2.4 GHz) for a certain period of time. For example, in response to the signal generating apparatus 200 being an MP3 player and the electronic apparatus 100 being a wireless headset and the two apparatuses perform a Bluetooth® communication with each other as in (a) in FIG. 2, the MP3 Player transmits a 2.4 GHz signal and the transmitted signal is received as an input signal by the signal receiver 110 of the wireless headset, upon a user turning-on the MP3 player. The received 2.4 GHz signal is transmitted to the driving circuit 170 through the filter 160.

The driving circuit 170 outputs an ON signal to the power supply 140 based on the preset frequency signal as transmitted by the filter 160.

As shown in FIG. 4, the driving circuit 170 includes a first capacitor C1 to which voltages are charged according to an input of a preset frequency signal, a transistor Q1 which is turned on or off by a voltage transmitted by the first capacitor C1, and a second capacitor C2 to which voltages are charged according to the turning-on or off of the transistor Q1. As shown therein, the driving circuit 170 may further include a diode D1 which passes voltages output by resistors R1, R2, R3 and transistor Q1.

The transistor Q1 is turned on and off by an input of a preset frequency signal that is transmitted through the first capacitor C1. The second capacitor C2 is charged with a voltage that has passed through the diode D1 according to the turning-on and off of the resistor Q1. In response to a predetermined amount of power being charged to the second capacitor C2, the driving circuit 170 outputs a rising edge, and an ON signal is applied to the power supply 140 which corresponds to the rising edge. An OFF signal which is applied to the power supply 140 by the controller 150 (to be described later) may be output according to a falling edge.

The power supply 140 recognizes signals, which are in the form of the rising edge and the falling edge, as an ON signal and an OFF signal, respectively.

In the exemplary embodiment in FIGS. 3 and 4, an ON signal is in the form of a rising edge, but the exemplary embodiments are not limited thereto, and may be implemented to output an ON signal to the power supply 140 in various forms. For example, in response to an ON signal being in the form of a falling edge or a rising edge or in response to a falling edge being repeated certain times, i.e., twice or more, an ON signal may be applied to the power supply 140.

As explained above, the signal receiver 110 receives a carrier frequency signal through Bluetooth®, as the preset frequency signal, but the exemplary embodiments are not limited thereto, and may apply to the electronic apparatus 100 which receives clock frequency or carrier frequency signals through various wired/wireless communications. In this case, the filter 160 is implemented to pass a corresponding clock frequency or carrier frequency.

In the electronic apparatus 100 according to an exemplary embodiment, power is supplied only to the filter 160 and the driving circuit 170 upon power-off, including a stand-by mode. Therefore, the electronic apparatus 100 may greatly reduce power consumption compared to the existing electronic apparatus 10 which supplies power to the controller 50 as in FIG. 1.

The electronic apparatus 100 according to an exemplary embodiment may additionally include a small-sized battery to supply very low power to the filter 160 and the driving circuit 170 and does not consume power upon the electronic apparatus 100 turning off.

The power supply 140 supplies power to the elements of the electronic apparatus 100 including the controller 160, by an ON signal applied by the driving circuit 170.

In response to the controller 150 being turned on, the controller conducts initialization, and an OFF output terminal of the controller 150 is set as high.

The controller 150, to which power is supplied, determines whether the signal receiver 110 continues to receive a preset frequency signal. In response to a determination that the signal receiver 110 does not receive the preset frequency signal, the controller 150 outputs an OFF signal to the power supply 140.

Therefore, both minimized power consumption and automatic power on/off may be obtained. Even in response to the driving circuit 170 applying an ON signal and power being supplied due to other signals from surrounding devices, power is automatically turned off by a control of the controller 150, and continuation of power consumption due to error may be prevented.

In response to an OFF signal being applied to the power supply 140, power supplied to all of elements of the electronic apparatus 100, except for the filter 160 and the driving circuit 170, is turned off. Accordingly, the entire system becomes an OFF state. An OFF output terminal of the controller 150 is changed to low.

In the electronic apparatus 100 according to an exemplary embodiment, the driving circuit 170 outputs an ON signal to the power supply 140 and the controller outputs an OFF signal thereto, and the power supply 140 is implemented to be turned on and off by different elements. Also, the controller 150 determines whether the preset frequency signal is continuously received, and outputs an OFF signal to the power supply 140 in response to the preset frequency signal not being received.

In the electronic apparatus 100 according to an exemplary embodiment, the controller 150 determines whether the preset frequency signal is continuously received and prevents any power supply operation that may be performed in error. Otherwise, to prevent power from being supplied to the power supply in error, the filter 160 may include a plurality of band pass filters BP1 161, BP2 162 and BP3 163, and the driving circuit 170 may output an ON signal by a combination of two or more frequencies.

Figure 5:
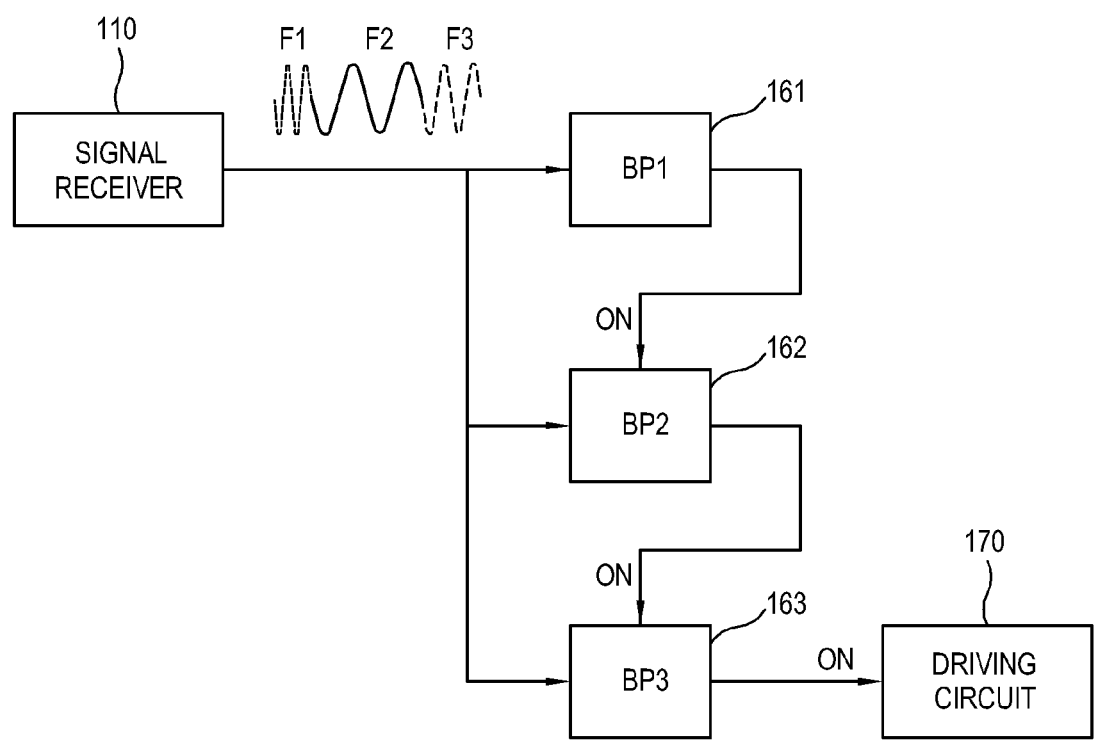
FIGS. 5 to 7 illustrate exemplary embodiments in which a filter includes a plurality of band pass filters.
Figure 6:
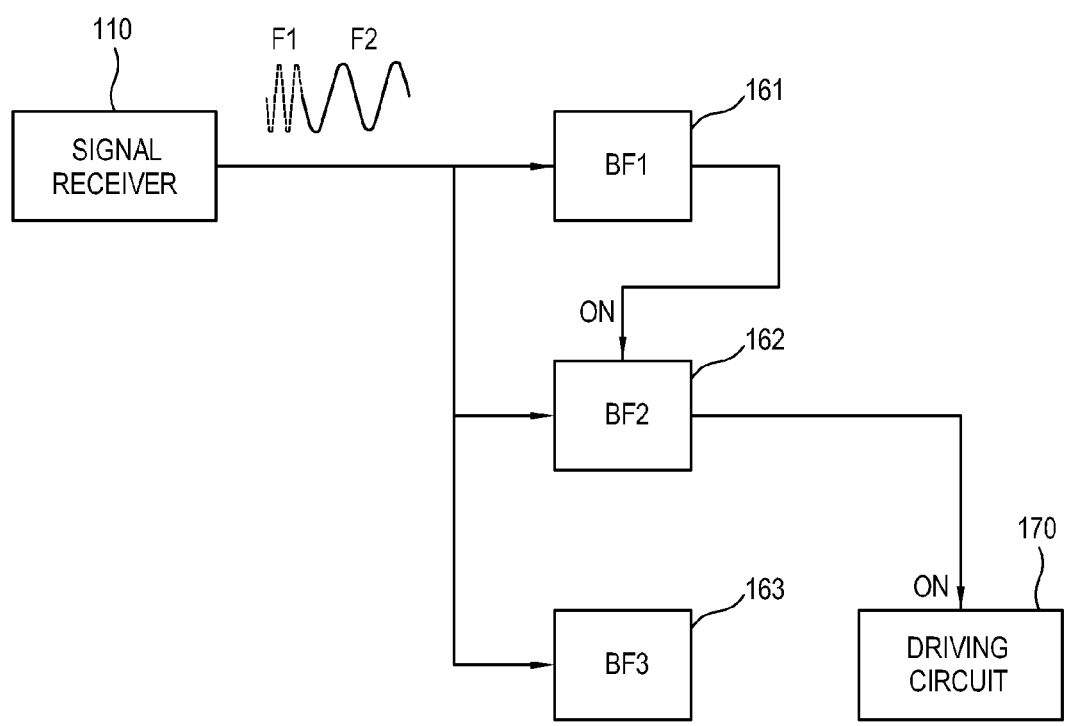
Figure 7:
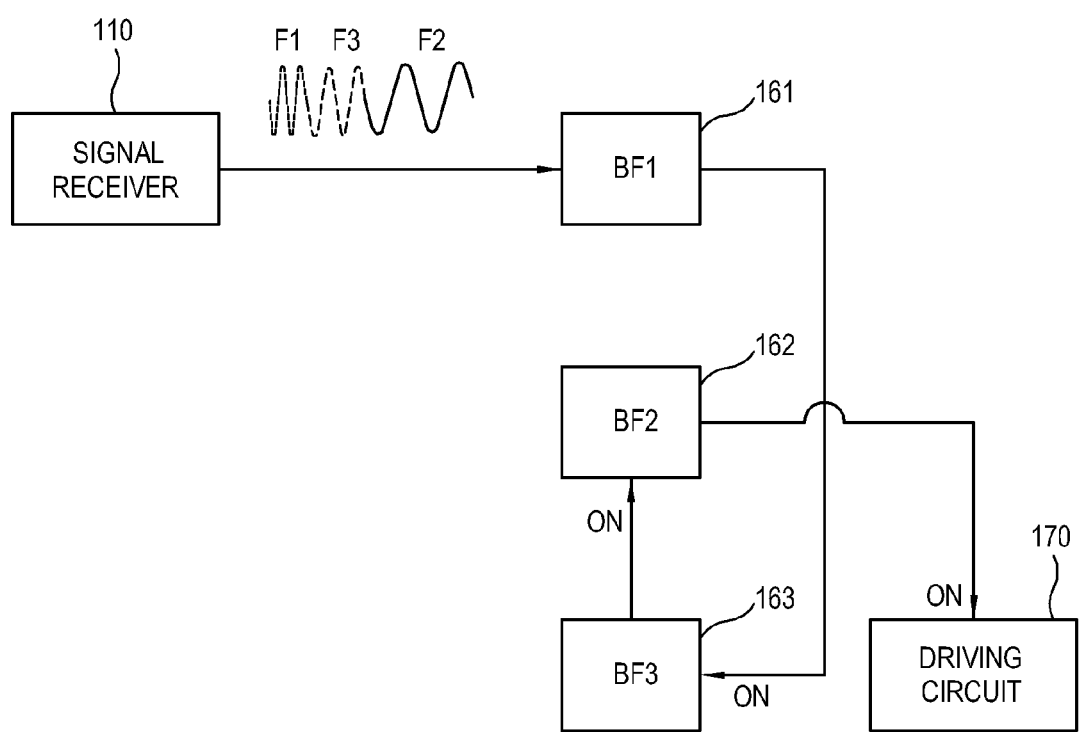

FIGS. 5 to 7 illustrate exemplary embodiments in which the filter 160 includes a plurality of band pass filters.

As shown in FIG. 5, the filter 160 may include first to third band pass filters BP1 161, BP2 162 and BP3 163 which are set to pass different frequencies F1, F2 and F3, respectively. The first to third band pass filters BP1 161, BP2 162 and BP3 163 may be connected in series.

In response to the BP1 161, BP2 162 and BP3 163 being connected in series, frequency signals F1, F2 and F3 which are sequentially received as input signals by the signal receiver 110, as in FIG. 5, pass the BP1 161, BP2 162 and BP3 163 sequentially and are output to the driving circuit 170. The power supply 140 is then prevented from receiving an ON signal by other signals except for the frequency signals in the order of F1, F2 and F3. The plurality of frequencies F1, F2 and F3 may vary.

For example, in response to the signal generating apparatus 200 being an MP3 player and the electronic apparatus 100 is a wireless headset, and in response to the two apparatuses performing Bluetooth®, the wireless headset remains turned off except in response to the headset sequentially receiving frequency signals F1, F2 and F3 (e.g., 2.46 GHz, 2.41 GHz and 2.4 GHz) even if other devices using a carrier frequency similar to the carrier frequency of the MP3 player are located nearby. The size and sequence of the frequencies F1, F2 and F3 may be set in advance to be in sync with the signal generating apparatus 200 and the electronic apparatus 100.

The respective band pass filters BP1 161, BP2 162 and BP3 163 may include an activating terminal so that a particular band pass filter may be selectively activated. For example, the first and second band pass filters BP1 161 and BP2 162 are activated as in FIG. 6, and in response to the first and second frequencies F1 and F2 being sequentially received, an ON signal is applied to the driving circuit 170.

The electronic apparatus 100 may include a band selection part (not shown) built therein, and select a particular band pass filter through the band selection part, or the sequence of selecting the band pass filters may vary. The selection and setting of the band pass filters by the band selection part may be implemented by various electric or mechanic methods.

For example, in response to frequency signals sequentially passing the band pass filters BP1 161, BP2 162 and BP3 163, an ON signal may be applied to the driving circuit 170 as shown in FIG. 7. As such, only in response to the frequency signals F1, and F3 and F2 being sequentially input, is an ON signal applied by the driving circuit 170 to the power supply 140.

In response to the input frequency being set by combining the plurality of frequencies through the plurality of band pass filters, a turn-on frequency specific to a particular electronic apparatus may be set to the signal generating apparatus 200 and thus the electronic apparatus 100 may be turned on by the signal generating apparatus 200 of a particular user, rather than from other users.

For example, MP3 players which are manufactured by the same manufacturer may have different frequencies assigned thereto according to serial numbers of the MP3 players, and the band pass filters 161, 162 and 163 of the filter 160 of a wireless headset may be set to turn on the wireless headset which corresponds to the turn-on frequency of the MP3 player. Then, a user who has purchased the electronic apparatus 100 (i.e., wireless headset) may set the filter 160 which corresponds to the turn-on frequency of the signal generating apparatus 200 (i.e., MP3 player) to thereby turn on the electronic apparatus 100 only in response to the specific turn-on frequency being input.

In the foregoing exemplary embodiments, three band pass filters BP1 161, BP2 162 and BP3 163 are provided as an example, but the number of the band pass filters BP1 161, BP2 162 and BP3 163 is not limited thereto, and may vary. The respective band pass filters BP1 161, BP2 162 and BP3 163 may be connected in parallel rather than in series or by a combination of serial and parallel connections.

In the exemplary embodiments, the electronic apparatus 100 outputs images or audios, but as the case may be, it may be implemented as an apparatus that does not output audio or images, e.g., as a remote controller that is turned by receiving an input signal from a TV in response to the TV being turned on.

Hereinafter, a power controlling process of the electronic apparatus 100 according to the exemplary embodiments will be described with reference to the accompanying drawings.

Figure 8:
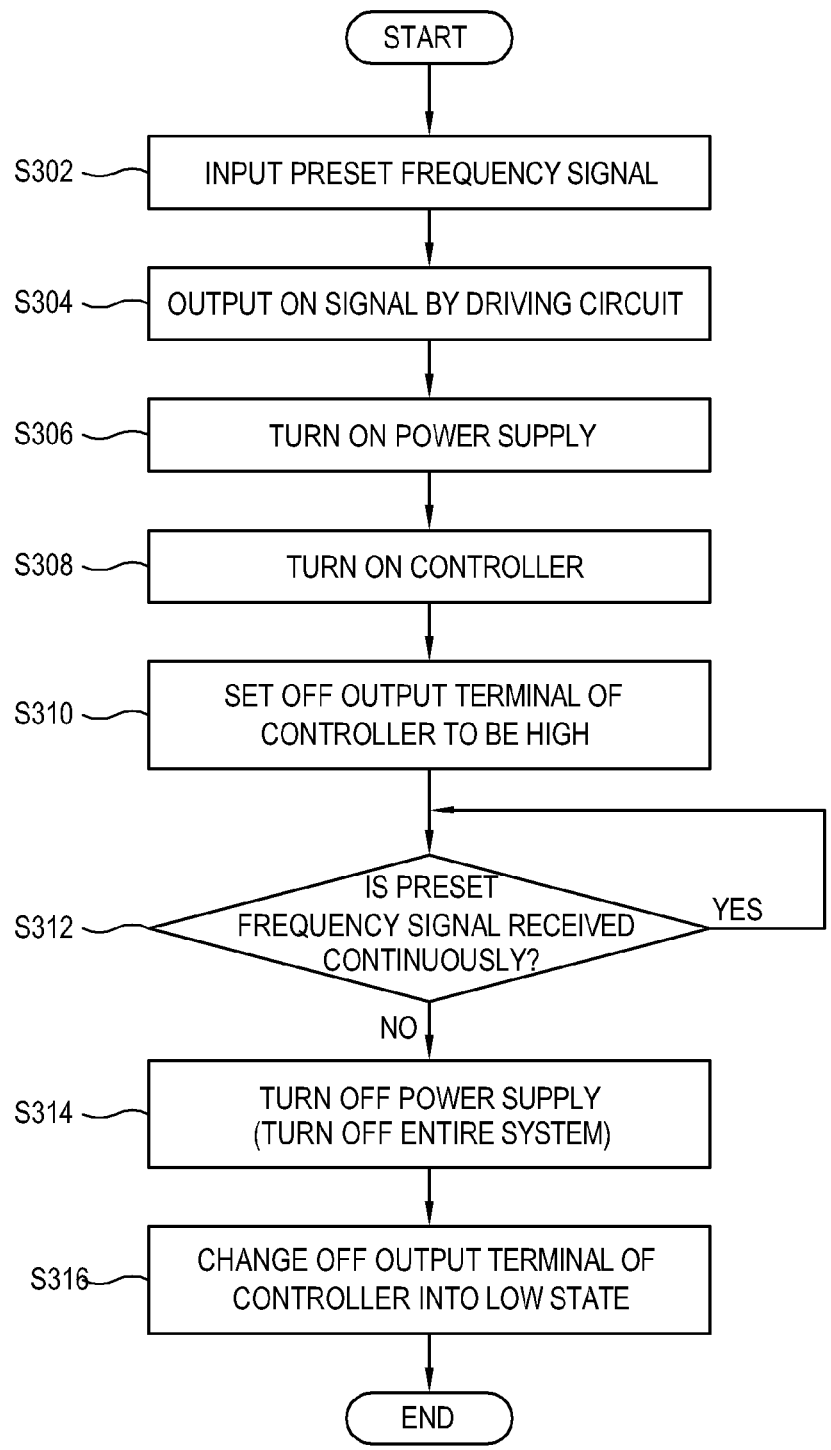
FIG. 8 is a flowchart showing a method of controlling power to the electronic apparatus, according to an exemplary embodiment.

FIG. 8 is a flowchart which shows method of controlling power to the electronic apparatus 100, according to an exemplary embodiment.

As shown therein, in response to the electronic apparatus 100 according to an exemplary embodiment remaining turned off, the signal receiver 110 may receive a preset frequency signal (in clock frequency or carrier frequency) as an input signal (S302). In response to the electronic apparatus 100 remaining turned off, the controller 150 does not receive power, and stand-by power of the electronic apparatus 100 is maintained close to zero.

The preset frequency signal that is received at operation S302 is transmitted to the driving circuit 170 through the filter 160, and the driving circuit 170 outputs the ON signal to the power supply 140 (S304).

Then, the power supply 140 is turned on (S306).

In response to the power supply 140 being turned on at operation S306, power is supplied to the respective elements of the electronic apparatus 100 and accordingly, the controller 150 which remains turned off is then turned on (S308).

In response to the controller 150 being turned on at operation S308, an initialization process is performed, and the OFF output terminal of the controller 150 is set to be high (S310).

The controller 150 monitors whether the preset frequency signal that has been received at operation S302 is continuously received (S312). In response to the preset frequency signal being continuously received, the electronic apparatus 100 performs operations necessary while in the turn-on state (e.g., output sound of MP3).

In response to a determination that the preset frequency signal is not received any more at operation S312, the controller 150 applies the OFF signal to the power supply 140 (S314). Accordingly, the entire system of the electronic apparatus 100 is turned off.

In response to the OFF signal being output to the power supply 140 at operation S314, the OFF output terminal of the controller 150 is changed to low, and power is not supplied to the controller 150 any more (S316).

In response to an input signal that is received by the signal receiver 110 including a preset frequency signal, the operations after operation S302 may be performed.

According to an exemplary embodiment, the electronic apparatus is automatically turned on and off by an input signal in a predetermined frequency without a user's manipulation of an additional power switch, and thus the user's convenience may be improved.

In response to the electronic apparatus being turned off as in the stand-by mode, the entire system including the controller is turned off and the driving circuit which consumes little power applies the ON signal to thereby minimize the stand-by power consumption of the electronic apparatus and satisfy electricity-related regulations, according to energy saving policies.

Also, the turn-on frequency specific to the electronic apparatus is set to prevent an erroneous power supply to the electronic apparatus due to a similar frequency signal from the surroundings.

Although a few exemplary embodiments have been shown and described, it will be appreciated by those skilled in the art that changes may be made in these exemplary embodiments without departing from the principles and spirit of the invention, the range of which is defined in the appended claims and their equivalents.

What is claimed is:

1. An electronic apparatus comprising:
   a signal receiver configured to receive an input signal;
   a power supply configured to supply power to elements of the electronic apparatus;
   a controller configured to control power supplied to the power supply; and
   a driving circuit configured to output an ON signal to the power supply in response to the signal receiver receiving a preset frequency signal while the controller is turned off,
   wherein the power supply is further configured to supply power to the elements of the electronic apparatus in response to the ON signal being received from the driving circuit, and
   wherein the controller is further configured to output an OFF signal to the power supply in response to the signal receiver not receiving the preset frequency signal within a predetermined period of time.

2. The electronic apparatus according to claim 1, wherein the preset frequency signal comprises a clock frequency of a wired digital signal or a carrier frequency of a wireless digital signal.

3. The electronic apparatus according to claim 2, wherein the signal receiver is configured to receive at least one of a wired digital signal, a wireless digital signal and an analog signal.

4. The electronic apparatus according to claim 3, wherein the signal receiver receives the analog signal to which the preset frequency signal has been added.

5. The electronic apparatus according to claim 1, further comprising a filter which passes the preset frequency signal out of the input signals and transmits the preset frequency signal to the driving circuit.

6. The electronic apparatus according to claim 5, wherein the driving circuit comprises a transistor which is turned on and off by an input of the preset frequency signal, and a capacitor to which voltages are charged according to the transistor turning on and off.

7. The electronic apparatus according to claim 6, wherein the driving circuit outputs a rising edge according to the charging of the capacitor, and applies an ON signal to the power supply which corresponds to the rising edge.

8. The electronic apparatus according to claim 5, wherein the ON signal of the driving circuit corresponds to one of a rising edge signal and a falling edge signal.

9. The electronic apparatus according to claim 5, wherein the preset frequency signal comprises a plurality of frequencies, and the filter comprises a plurality of band pass filters that pass the plurality of frequencies in a preset order.

10. The electronic apparatus according to claim 9, wherein the plurality of frequencies are variable.

11. The electronic apparatus according to claim 1, wherein the power supply supplies power to the controller which remains turned off according to the ON signal, and the controller determines whether the signal receiver receives the preset frequency signal.

12. A method of controlling power to an electronic apparatus which comprises a power supply, the power controlling method comprising:
  receiving an input signal comprising a preset frequency signal by a signal receiver while a controller controlling supply of power to the power supply is turned off;
  outputting an ON signal to the power supply by a driving circuit in response to the signal receiver receiving the input signal comprising the preset frequency signal;
  supplying power to elements of the electronic apparatus comprising the controller by the power supply in response to the ON signal being received from the driving circuit; and
  outputting an OFF signal to the power supply by the controller in response to the preset frequency signal not being received within a predetermined period of time.

13. The power controlling method according to claim 12, wherein the preset frequency signal comprises a clock frequency of a wired digital signal or a carrier frequency of a wireless digital signal.

14. The power controlling method according to claim 13, wherein the receiving the input signal comprises receiving at least one of a wired digital signal, a wireless digital signal and an analog signal.

15. The power controlling method according to claim 14, wherein the receiving the input signal comprises receiving the analog signal to which the preset frequency signal has been added.

16. The power controlling method according to claim 12, further comprising passing the preset frequency signal out of the input signal and transmitting the preset frequency signal to the driving circuit.

17. The power controlling method according to claim 16, wherein the ON signal of the driving circuit corresponds to one of a rising edge signal and a falling edge signal.

18. The power controlling method according to claim 16, wherein the preset frequency comprises a plurality of frequencies, and the transmitting the preset frequency signal comprises passing the plurality of frequencies in a preset order.

19. The power controlling method according to claim 18, wherein the plurality of frequencies is variable.

20. The power controlling method according to claim 12, further comprising:
  supplying power to the power supply according to the ON signal to the controller that is turned off; and
  determining by the controller whether the preset frequency signal is being continuously received.

21. An electronic apparatus comprising:
  a power supply configured to supply power to elements of the electronic apparatus;
  a controller configured to control power supplied to the power supply; and
  a driving circuit configured to output an ON signal to the power supply in response to the electronic apparatus receiving a preset frequency signal from an external device while the controller is turned off,
  wherein the power supply is further configured to supply power to the elements of the electronic apparatus in response to the ON signal being received from the driving circuit, and
  wherein the controller is further configured to output an OFF signal to the power supply in response to the signal receiver not receiving the preset frequency signal within a predetermined period of time.

22. The electronic apparatus of claim 21, further comprising a signal receiver configured to receive the input signal.

23. The electronic apparatus of claim 22, further comprising a filter which passes the preset frequency signal out of the input signals and transmits the preset frequency signal to the driving circuit.

24. The electronic apparatus according to claim 23, wherein the driving circuit comprises a transistor which is turned on and off by an input of the preset frequency signal, and a capacitor to which voltages are charged according to the transistor turning on and off.

25. The electronic apparatus according to claim 24, wherein the driving circuit outputs a rising edge according to the charging of the capacitor, and applies an ON signal to the power supply which corresponds to the rising edge.

* * * * *